(12) United States Patent
Torii

(10) Patent No.: US 12,136,541 B2
(45) Date of Patent: Nov. 5, 2024

(54) WIRING ABNORMALITY DETECTION METHOD AND PLASMA PROCESSING APPARATUS

(71) Applicant: Tokyo Electron Limited, Tokyo (JP)

(72) Inventor: Natsumi Torii, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 241 days.

(21) Appl. No.: 17/540,255

(22) Filed: Dec. 2, 2021

(65) Prior Publication Data

US 2022/0172932 A1  Jun. 2, 2022

(30) Foreign Application Priority Data

Dec. 2, 2020 (JP) ................... 2020-200322

(51) Int. Cl.
*H01J 37/32* (2006.01)

(52) U.S. Cl.
CPC .. *H01J 37/32935* (2013.01); *H01J 37/32174* (2013.01)

(58) Field of Classification Search
CPC ........... H01J 37/32935; H01J 37/32174; H01J 37/32715; H01J 37/3288; H01J 37/32889; H01J 37/32532; H01J 37/32706; H01J 37/32495; H01J 37/32082; G01R 31/083; G01R 19/0038; G01R 23/165; G01R 31/2865; G01R 31/52; G01R 31/58; H01L 21/6833; H01L 21/3065; H01L 21/6831
See application file for complete search history.

(56) References Cited

U.S. PATENT DOCUMENTS

2007/0215282 A1* 9/2007 Itabashi ............ H01J 37/32706
156/345.35
2011/0199093 A1* 8/2011 Fujisawa ............ H01L 21/6833
324/537

FOREIGN PATENT DOCUMENTS

| JP | H10127072 A | 5/1998 |
| JP | 10-308439 A | 11/1998 |
| JP | 2009239222 A | 10/2009 |

* cited by examiner

*Primary Examiner* — Renan Luque
(74) *Attorney, Agent, or Firm* — XSENSUS LLP

(57) ABSTRACT

There is provided a wiring abnormality detection method in a plasma processing apparatus. The detection method comprises: applying a DC voltage from a DC power supply; measuring a current flowing in a circuit constituting a DC power supply system; comparing a measured current with a predetermined threshold value; and determining that wiring abnormality has occurred in the circuit constituting the DC power supply system when the measured current is greater than or equal to the threshold value.

18 Claims, 8 Drawing Sheets

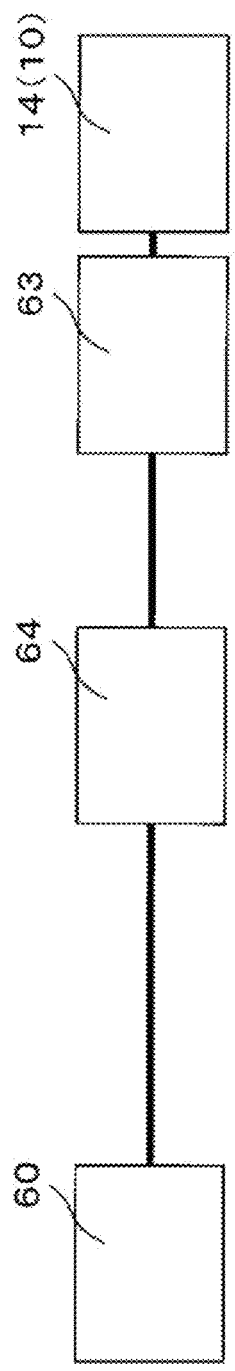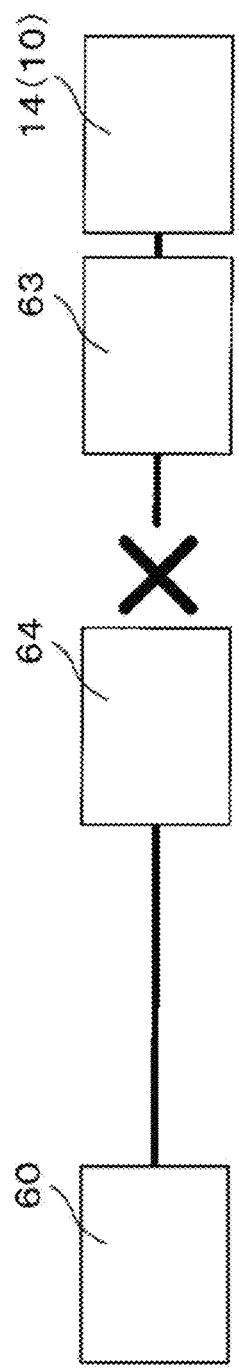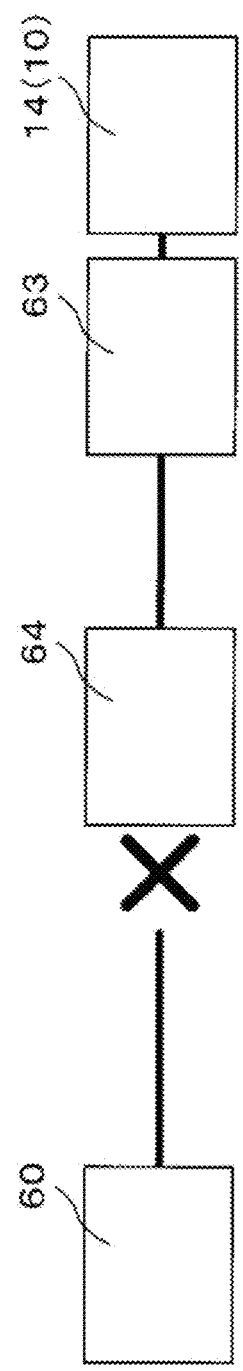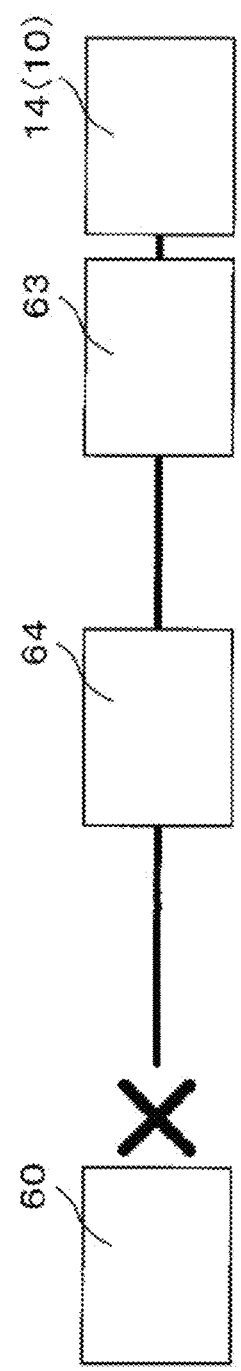

WIRING ABNORMALITY DETECTION METHOD AND PLASMA PROCESSING APPARATUS

CROSS-REFERENCE TO RELATED APPLICATION

This application claims priority to Japanese Patent Application No. 2020-200322 filed on Dec. 2, 2020, the entire contents of which are incorporated herein by reference.

TECHNICAL FIELD

The present disclosure relates to a wiring abnormality detection method and a plasma processing apparatus.

BACKGROUND

Japanese Patent Application Publication No. H10-308439 discloses a method for detecting disconnection of an electrostatic chuck circuit, in which a voltage applied from a DC power supply to an electrostatic chuck is higher when a substrate is not placed on the electrostatic chuck than when the substrate is attracted and held on the electrostatic chuck. In accordance with the method disclosed in Japanese Patent Application Publication No. H10-308439, the disconnection of the electrostatic chuck circuit is detected by way of measuring a magnitude of a current that flows between the DC power supply and the electrostatic chuck by the application of the voltage.

SUMMARY

The technique of the present disclosure appropriately detects wiring abnormality in a DC power supply system of a plasma processing apparatus.

In accordance with an aspect of the present disclosure, there is provided a wiring abnormality detection method in a plasma processing apparatus. The plasma processing apparatus includes: a chamber where plasma processing is performed on a substrate; a stage disposed in the chamber and having an electrostatic chuck configured to chuck the substrate; a DC power supply system configured to control plasma generated in the chamber; and an ammeter configured to measure a current flowing in the DC power supply system. The DC power supply system constitutes a circuit in which a DC power supply configured to apply a DC voltage to the DC power supply system, an RF filter configured to remove an RF component from the DC power supply, and a DC voltage application member to which the DC voltage is applied are electrically connected in this order. The detection method comprises: applying a DC voltage from the DC power supply; measuring a current flowing in the circuit constituting the DC power supply system; comparing the measured current with a predetermined threshold value; and determining that wiring abnormality has occurred in the circuit constituting the DC power supply system when the measured current is greater than or equal to the threshold value.

BRIEF DESCRIPTION OF THE DRAWINGS

The objects and features of the present disclosure will become apparent from the following description of embodiments, given in conjunction with the accompanying drawings, in which:

FIGS. 4A to 4D schematically explain wiring abnormality in the DC power supply system;

DETAILED DESCRIPTION

Figure 1:
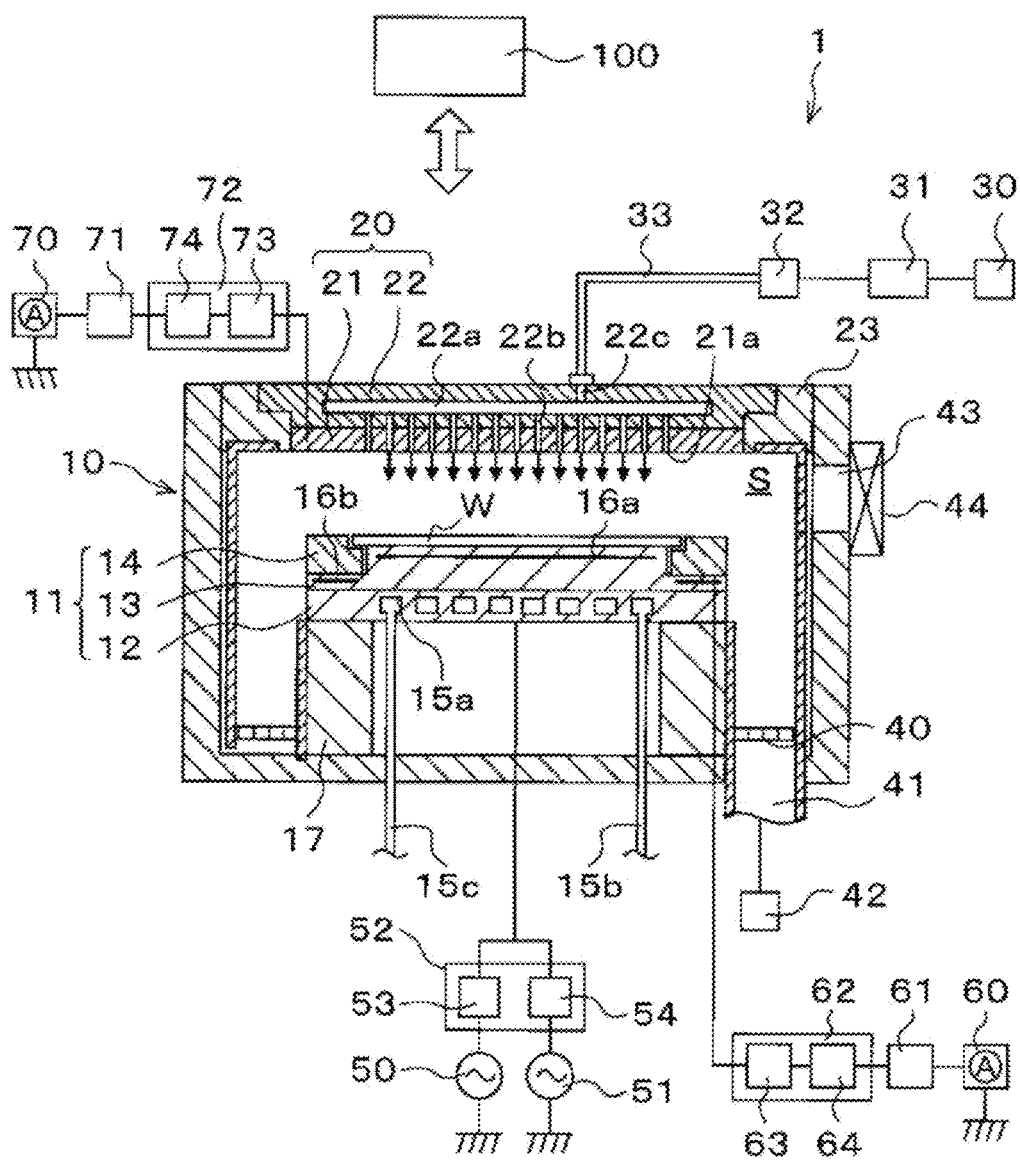
FIG. 1 is a vertical cross-sectional view showing a schematic configuration of a plasma processing apparatus according to an embodiment.

In a semiconductor device manufacturing process, a processing gas is supplied to a semiconductor wafer (hereinafter, simply referred to as "wafer"), and various plasma processing such as etching, film formation, diffusion, and the like are performed on the wafer. Recently, in such plasma processing, a safety test became stricter due to the effect of a higher power or a higher voltage. In particular, there is a demand for an interlock mechanism for preventing access to an active part during an active state or stopping a power output when the access is detected.

Conventionally, it is suggested to provide, as the above-described interlock mechanism, e.g., an interlock key at a connector of a transmission line of a plasma processing apparatus. Alternatively, the connector is covered with an interlock cover and cannot be attached/detached unless the cover is removed. In addition, it is suggested to provide the interlock cover at a position where a switch linked with a power output operation of the plasma processing apparatus is pressed so that the power output can be automatically cut off when the cover is removed during the active state, for example.

However, in the conventional interlock mechanism, it was possible to enable the interlock mechanism even when wiring is not connected or disconnected (hereinafter, non-connection and disconnection of the wiring may be collectively referred to as "wiring abnormality"). In other words, even if wiring abnormality occurs, the interlock mechanism may not be able to detect the abnormality and the power can be output, which may cause abnormal discharge or electric shock of an operator. Particularly, in the plasma processing apparatus, in a DC power supply system (e.g., an upper electrode circuit, an edge ring circuit, or the like) for performing plasma control, a plasma potential is directly observed in each wiring. Therefore, when wiring abnormality occurs, there is a high risk of abnormal discharge at the time of plasma generation.

From the above, in the plasma processing apparatus, it is required to appropriately detect wiring abnormality in the DC power supply system. Japanese Patent Application Publication No. H10-308439 discloses the method for detecting disconnection in an electrostatic chuck circuit. Although Japanese Patent Application Publication No. H10-308439 discloses detection of disconnection in the electrostatic chuck circuit for holding the wafer, but does not disclose detection of disconnection in the DC power supply system for performing the above-described plasma control.

The technique of the present disclosure appropriately detects wiring abnormality in the DC power supply system of the plasma processing apparatus, particularly in the upper electrode circuit or the edge ring circuit. Hereinafter, a plasma processing apparatus as a substrate processing system and a wafer processing method as a substrate processing method according to the embodiments will be described with reference to the accompanying drawings. Further, like reference numerals will be given to like parts having substantially the same functions throughout this specification and the drawings, and redundant description thereof will be omitted.

<Plasma Processing Apparatus>

Figure 2:
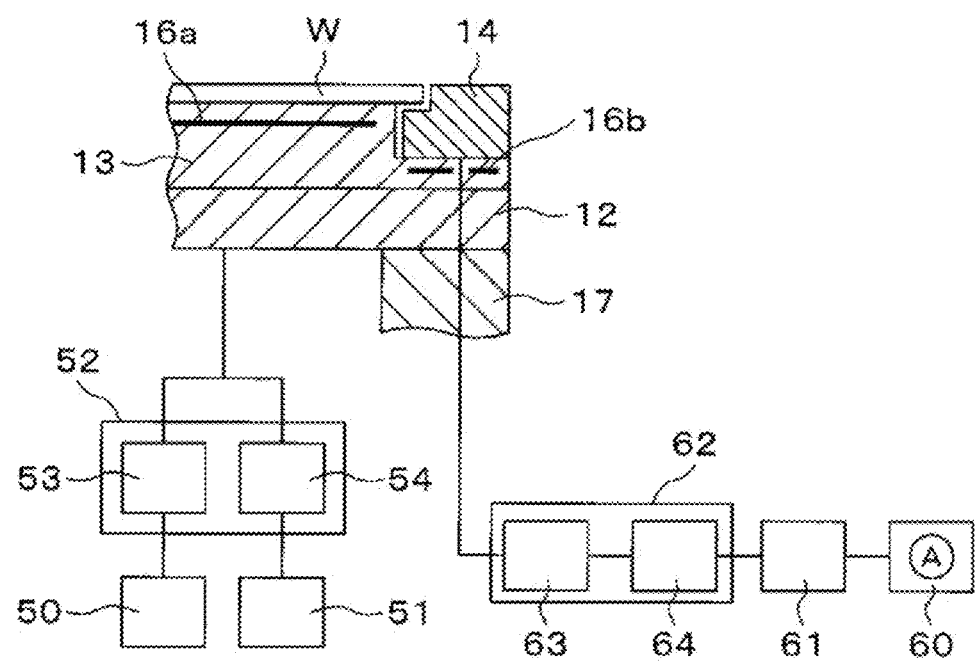
FIG. 2 illustrates a configuration example of a DC power supply system of the plasma processing apparatus according to the embodiment.

First, the plasma processing apparatus according to the embodiment will be described. FIG. 1 is a vertical cross-sectional view showing a schematic configuration of a plasma processing apparatus 1. FIG. 2 explains an example of a power supply system of the plasma processing apparatus 1. The plasma processing apparatus 1 performs plasma processing such as etching, film formation, diffusion, or the like on a wafer W as a substrate.

As shown in FIG. 1, the plasma processing apparatus 1 includes a substantially cylindrical chamber 10. The chamber 10 defines a processing space S in which plasma is generated. The chamber 10 is made of, e.g., aluminum. The chamber 10 is connected to a ground potential.

A stage 11 on which the wafer W is placed is disposed in the chamber 10. The stage 11 includes a lower electrode 12, an electrostatic chuck 13, and an edge ring 14. An electrode plate (not shown) made of, e.g., aluminum, may be disposed on a bottom surface side of the lower electrode 12.

The lower electrode 12 is made of a conductive metal such as aluminum or the like, and has a substantially disc shape.

A coolant channel 15a is formed in the lower electrode 12. A coolant is supplied from a chiller (not shown) disposed outside the chamber 10 to the coolant channel 15a through a coolant inlet line 15b. The coolant supplied to the coolant channel 15a returns to the chiller through a coolant outlet line 15c. By circulating the coolant such as cooling water or the like through the coolant channel 15a, the electrostatic chuck 13, the edge ring 14, and the wafer W can be cooled to a desired temperature.

The electrostatic chuck 13 is disposed on the lower electrode 12. The electrostatic chuck 13 is configured to chuck both the wafer W and the edge ring 14 using an electrostatic force. An upper surface of a central portion of the electrostatic chuck 13 is higher than an upper surface of a peripheral portion thereof. The upper surface of the central portion of the electrostatic chuck 13 serves as a wafer placement surface on which the wafer W is placed, and the upper surface of the peripheral portion of the electrostatic chuck 13 serves as an edge ring placement surface on which the edge ring 14 is placed.

A first electrode 16a for attracting and holding the wafer W is disposed at a central portion in the electrostatic chuck 13. A second electrode 16b for attracting and holding the edge ring 14 is disposed at a peripheral portion in the electrostatic chuck 13. The electrostatic chuck 13 has a structure in which electrodes 16a and 16b are embedded between insulating members made of an insulating material.

A DC voltage from a DC power supply (not shown) is applied to the first electrode 16a. Accordingly, an electrostatic force is generated, and the wafer W is attracted and held on the upper surface of the central portion of the electrostatic chuck 13. Similarly, a DC voltage from the DC power supply (not shown) is applied to the second electrode 16b. Accordingly, an electrostatic force is generated, and the edge ring 14 is attracted and held on the upper surface of the peripheral portion of the electrostatic chuck 13.

In the present embodiment, the central portion of the electrostatic chuck 13 where the first electrode 16a is disposed and the peripheral portion of the electrostatic chuck 13 where the second electrode 16b is disposed are integrated. However, the central portion and the peripheral portion may be separable.

The edge ring 14 as a DC voltage applying member is an annular member disposed to surround the wafer W placed on the upper surface of the central portion of the electrostatic chuck 13, and a DC voltage from a DC power supply 60 to be described later is applied to the edge ring 14. The edge ring 14 is provided to improve uniformity of plasma processing. Therefore, the edge ring 14 is made of a material that is appropriately selected depending on plasma processing, and may be made of, e.g., Si or SiC.

The stage 11 configured as described above is fastened to a substantially cylindrical support member 17 disposed at a bottom portion of the chamber 10. The support member 17 is made of an insulator such as ceramic, quartz, or the like.

Although it is not illustrated, the stage 11 may include a temperature control module configured to adjust at least one of the electrostatic chuck 13, the edge ring 14, and the wafer W to a desired temperature. The temperature control module may include a heater, a flow path, or a combination thereof. A temperature control fluid such as a coolant or a heat transfer gas flows through the flow path.

A shower head 20 is disposed above the stage 11 to face the stage 11. The shower head 20 includes an electrode plate 21 disposed to face the processing space S, and an electrode support 22 disposed above the electrode plate 21. The electrode plate 21 functions as an upper electrode paired with the lower electrode 12. As will be described later, when a first RF power supply 50 is electrically connected to the lower electrode 12, the shower head 20 is connected to the ground potential. The shower head 20 is supported at an upper portion (ceiling surface) of the chamber 10 via an insulating shielding member 23.

The electrode plate 21 has a plurality of gas injection holes 21a for supplying a processing gas from a gas diffusion space 22a to be described later to the processing space S. The electrode plate 21 is formed of, e.g., a conductor or a semiconductor having a low electrical resistivity with less Joule heat generated. Further, a DC voltage from a second DC power supply 70 to be described later is applied to the electrode plate 21.

The electrode support 22 attachably/detachably supports the electrode plate 21. The electrode support 22 has a structure in which a plasma resistant film is formed on a surface of a conductive material such as aluminum or the like. The plasma resistant film may be a film formed by anodization or a ceramic film made of yttrium oxide. The gas diffusion space 22a is formed in the electrode support 22. A plurality of gas holes 22b communicating with the gas injection holes 21a extends from the gas diffusion space 22a. Further, a gas inlet opening 22c connected to a gas supply line 33 to be described later is formed in the gas diffusion space 22a.

A gas supply source group 30 for supplying a processing gas to the gas diffusion space 22a is connected to the electrode support 22 through a flow rate controller group 31, a valve group 32, the gas supply line 33, and the gas inlet opening 22c.

The gas supply source group 30 includes a plurality of gas supply sources required for plasma processing. The flow rate controller group 31 includes a plurality of flow rate controllers, and the valve group 32 includes a plurality of valves. Each of the plurality of flow rate controllers of the flow rate controller group 31 is a mass flow controller or a pressure control type flow rate controller. In the plasma processing apparatus 1, the processing gas from one or more gas supply sources selected from the gas supply source group 30 is supplied to the gas diffusion space 22a through the flow rate controller group 31, the valve group 32, the gas supply line 33, and the gas inlet opening 22c. Then, the processing gas supplied to the gas diffusion space 22a is diffused and supplied in a shower-like manner into the processing space S through the gas holes 22b and the gas injection holes 21a.

At the bottom portion of the chamber 10, a baffle plate 40 is disposed between an inner wall of the chamber 10 and the support member 17. The baffle plate 40 is formed by, for example, coating an aluminum material with ceramics such as yttrium oxide. A plurality of through-holes is formed in the baffle plate 40. The processing space S communicates with an exhaust port 41 through the baffle plate 40. An exhaust device 42 such as a vacuum pump or the like is connected to the exhaust port 41, and the exhaust device 42 is configured to reduce a pressure in the processing space S.

A loading/unloading port 43 for the wafer W is formed on a sidewall of the chamber 10, and the loading/unloading port 43 can be opened and closed by a gate valve 44.

As shown in FIGS. 1 and 2, the plasma processing apparatus 1 further includes the first RF power supply 50, a second RF power supply 51, and a matching device 52. The first RF power supply 50 and the second RF power supply 51 are connected to the lower electrode 12 through the matching device 52.

The first RF power supply 50 generates an RF power for plasma generation. The first RF power supply 50 supplies an RF power HF having a frequency of 27 MHz to 100 MHz, e.g., 40 MHz in one example, to the lower electrode 12. The first RF power supply 50 is connected to the lower electrode 12 through a first matching circuit 53 of the matching device 52. The first matching circuit 53 matches an output impedance of the first RF power supply 50 with an input impedance of a load side (the lower electrode 12 side). The first RF power supply 50 may not be electrically connected to the lower electrode 12, and may be connected to the shower head 20 serving as the upper electrode through the first matching circuit 53.

The second RF power supply 51 generates an RF power (RF bias power) LF for attracting ions into the wafer W, and supplies the RF power LF to the lower electrode 12. The RF power LF may have a frequency of 400 kHz to 13.56 MHz, e.g., 400 kHz in one example. The second RF power supply 51 is connected to the lower electrode 12 through a second matching circuit 54 of the matching device 52. The second matching circuit 54 matches an output impedance of the second RF power supply 51 with the input impedance of the load side (the lower electrode 12 side). A DC pulse generator may be used instead of the second RF power supply 51.

The plasma processing apparatus 1 further includes the DC power supply 60, a switching device 61, and an RF filter 62. The DC power supply 60 is electrically connected to the edge ring 14 through the switching device 61 and the RF filter 62. In the following description, the DC power supply 60, the switching device 61, the RF filter 62, and the edge ring 14 may be collectively referred to as "edge ring circuit" as the DC power supply system that is a wiring abnormality detection target according to the embodiment. Further, an upstream side of a current flow direction in the edge ring circuit, i.e., the DC power supply 60 side, may be simply referred to as "upstream side" and a downstream side of the current flow direction, i.e., the edge ring 14 side, may be simply referred to as "downstream side."

The DC power supply 60 applies a negative DC voltage for plasma control to the edge ring 14. The DC power supply 60 is a variable DC power supply, and can adjust a magnitude of a DC voltage. Further, the DC power supply 60 is configured to switch a voltage waveform applied to the edge ring 14 between a pulse wave and a continuous wave (CW).

The switching device 61 is configured to be able to stop the application of the DC voltage from the DC power supply 60 to the edge ring 14. Further, those skilled in the art can arbitrarily design a circuit configuration of the switching device 61.

The RF filter 62 is provided to protect the DC power supply 60, and has an HF filter 63 and an LF filter 64 for reducing or blocking an RF. The HF filter 63 reduces or blocks an RF of 40 MHz from the first RF power supply 50, for example. The LF filter 64 reduces or blocks an RF of 400 kHz from the second RF power supply 51, for example.

In one example, the impedance of the LF filter 64 is variable. In other words, the impedance of the LF filter 64 is variable by using a variable element for some elements of the LF filter 64. The variable element may be, e.g., a coil or a capacitor. The variable element is not limited to a coil or a capacitor, and any variable impedance element such as a diode or the like can achieve the same function. Further, the element itself may not be variable, and the impedance may be variable by switching the combination of elements having fixed values using a switching circuit. The circuit configuration of the LF filter 64 and the HF filter 63 may be arbitrarily designed by those skilled in the art.

The plasma processing apparatus 1 further includes a measuring device (not shown) for measuring a self-bias voltage of the edge ring 14 (or a self-bias voltage of the lower electrode 12 or the wafer W). The configuration of the measuring device may be arbitrarily designed by those skilled in the art.

The edge ring circuit configured as described above is provided with an ammeter A for measuring a current flowing through the edge ring circuit. The installation position of the ammeter A is not particularly limited. For example, the ammeter A may be disposed in the DC power supply 60 as shown in FIGS. 1 and 2, or may be disposed outside right behind the downstream side of the DC power supply 60.

The plasma processing apparatus 1 further includes the second DC power supply 70, a second switching device 71, and a second RF filter 72. The second DC power supply 70 is electrically connected to the electrode plate 21 through the second switching device 71 and the second RF filter 72. In the following description, the second DC power supply 70, the second switching device 71, the second RF filter 72, and the electrode plate 21 may be collectively referred to as "upper electrode circuit" as the DC power supply system that is a wiring abnormality detection target according to the embodiment.

The second DC power supply 70 applies a negative DC voltage for plasma control to the electrode plate 21. The second DC power supply 70 is a variable DC power supply, and can adjust a magnitude of the DC voltage. Further, the second DC power supply 70 is configured to switch a voltage waveform applied to the electrode plate 21 between a pulse wave and a continuous wave.

The second switching device 71 is configured to be able to stop the application of the DC voltage from the second DC power supply 70 to the electrode plate 21. Those skilled in the art can arbitrarily design the circuit configuration of the second switching device 71.

The second RF filter 72 is provided to protect the second DC power supply 70, and has an HF filter 73 and an LF filter 74 for reducing or blocking an RF. The HF filter 63 reduces or blocks an RF of 40 MHz from the first RF power supply 50, for example. The LF filter 74 reduces or blocks an RF of 400 kHz from the second RF power supply 51, for example. The circuit configuration of the HF filter 73 and the LF filter 74 can be arbitrarily designed by those skilled in the art.

The upper electrode circuit configured as described above is provided with the ammeter A for measuring a current flowing through the upper electrode circuit. The installation position of the ammeter A is not particularly limited. For example, the ammeter A may be disposed in the second DC power supply 70 as shown in FIGS. 1 and 2, or may be disposed outside right behind the downstream side of the second DC power supply 70.

The plasma processing apparatus 1 includes a controller 100. The controller 100 is, e.g., a computer including a CPU, a memory, or the like, and has a program storage (not shown). The program storage stores a program for controlling plasma processing in the plasma processing apparatus 1. The program may be stored in a computer-readable storage medium and installed on the controller 100 from the storage medium.

While various embodiments have been described above, the present disclosure is not limited to the above-described embodiments, and various additions, omissions, substitutions and changes may be made. Further, other embodiments can be implemented by combining elements in different embodiments.

Figure 3:
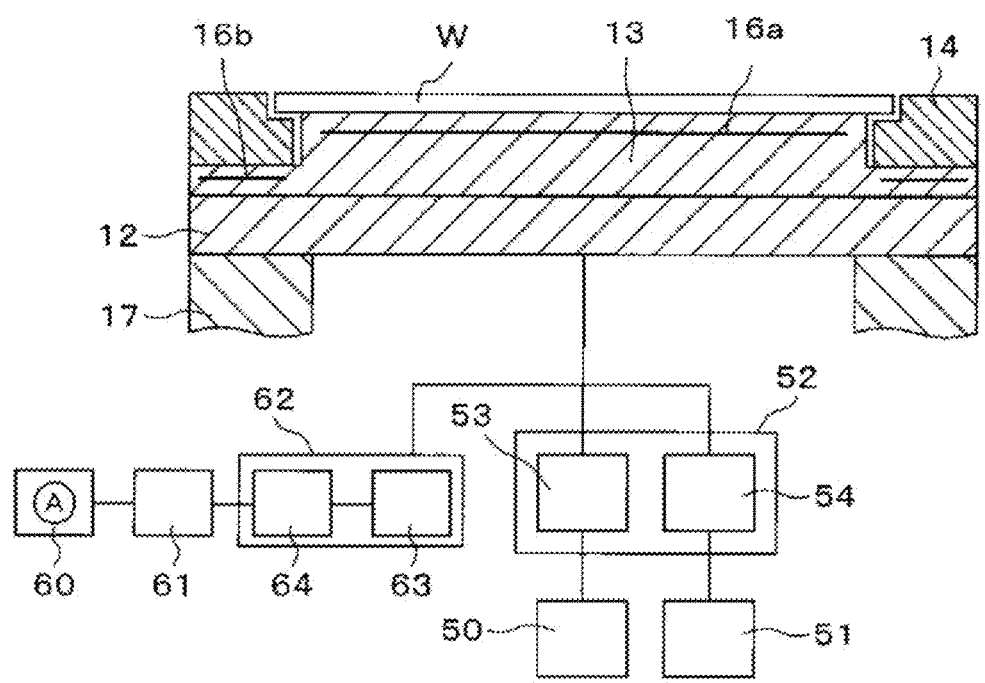
FIG. 3 illustrates another configuration example of the DC power supply system of the plasma processing apparatus according to the embodiment.

For example, in the above-described embodiment, the edge ring circuit is directly connected to the edge ring 14. However, as shown in FIG. 3, the edge ring circuit may be connected to the edge ring 14 through the lower electrode 12. In that case, the DC power supply for plasma control is applied to the edge ring 14 through the lower electrode 12.

<Wiring Abnormality Detection Method>

Next, a method for detecting wiring abnormality in the upper electrode circuit and the edge ring circuit in the plasma processing apparatus 1 configured as described above will be described. Since the method for detecting wiring abnormality in the upper electrode circuit and the method for detecting wiring abnormality in the edge ring circuit are the same, the method for detecting wiring abnormality in the edge ring circuit will be described below as an example.

FIGS. 4A to 4D are explanatory diagrams schematically illustrating wiring abnormality patterns of the edge ring circuit. FIG. 4A shows a normal connection state, and each of FIGS. 4B to 4D shows a state in which wiring abnormality has occurred. In the wiring abnormality detection according to the embodiment, as will be described later, the wiring abnormality in the edge ring circuit is detected based on a change in a circuit constant depending on the connection state of each element constituting the edge ring circuit, more specifically, a change in an electrostatic capacitance depending on the connection state. In the edge ring circuit shown in FIGS. 4A to 4D, the influence on the circuit constant at the time of wiring abnormality is so small to be ignored and, thus, the illustration of the switching device 61 is omitted.

As shown in FIG. 4A, the edge ring circuit generally has a configuration in which the DC power supply 60, the LF filter 64, the HF filter 63, and the edge ring 14 (the chamber 10) are electrically connected to each other through a wiring (e.g., a coaxial cable). In the edge ring circuit configured as described above, the wiring abnormality occurring in the wiring that connects the LF filter 64 and the HF filter 63 (FIG. 4B), the wiring abnormality occurring on the upstream side of the LF filter 64 (FIG. 4C), and the wiring abnormality occurring right behind the downstream side of the DC power supply 60 (FIG. 4D) are detected separately from the normal connection state (FIG. 4A) respectively depending on the change in the circuit constant at the time of wiring abnormality.

When wiring abnormality occurs in the wiring that connects the HF filter 63 and the edge ring 14 (the chamber 10), the amount of change in the circuit constant from the normal connection state (FIG. 4A) is substantially the same as that at the time of the wiring abnormality (FIG. 4B). Therefore, the detection is performed under the same conditions as the wiring abnormality (FIG. 4B).

Figure 5:
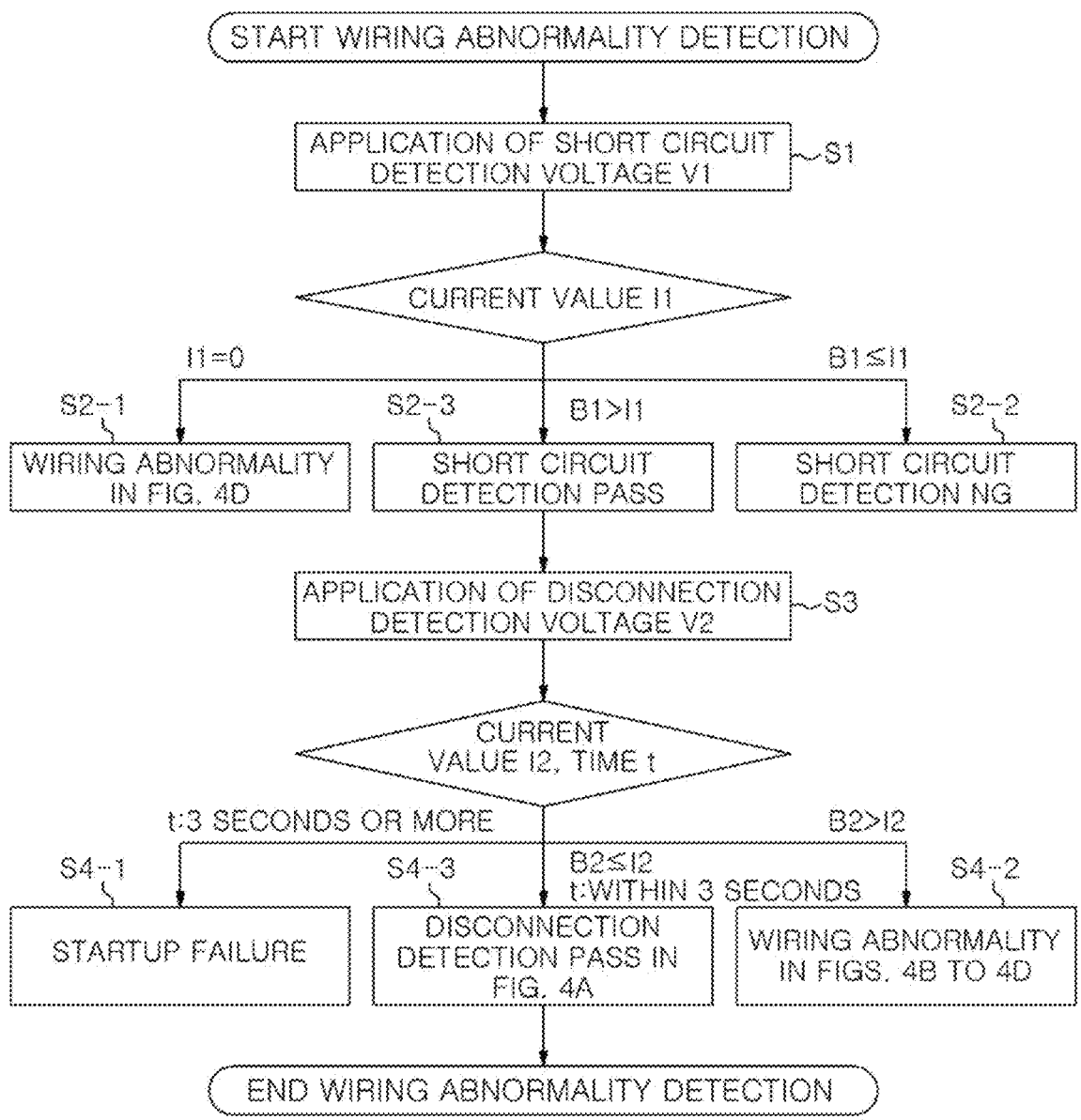
FIG. 5 is a flowchart showing a main process of a wiring abnormality detection method according to the embodiment.

FIG. 5 is a flowchart showing a main process of detecting wiring abnormality in the edge ring circuit according to the embodiment. The state (a) in the flowchart of FIG. 5 corresponds to the normal connection state (FIG. 4A) and the states (b) to (d) correspond to the states in which the wiring abnormality has occurred (FIGS. 4B to 4D) respectively.

As shown in FIG. 5, in the case of detecting the wiring abnormality in the edge ring circuit, first, in a state where the wafer W is not loaded into the plasma processing apparatus 1, a DC voltage for short circuit detection (hereinafter, may be referred to as "short circuit detection voltage V1") is applied from the DC power supply 60 to the edge ring 14 (step S1 in FIG. 5). As the short circuit detection voltage V1, for example, a voltage (e.g., 120 V) lower than the voltage applied to the edge ring 14 during plasma processing on the wafer W can be applied under pulse conditions having a frequency of 20 kHz and a duty ratio of 60%. The waveform of the short circuit detection voltage V1 is not limited to a pulse wave, and may be a continuous wave.

Next, the current flowing through the edge ring circuit due to the application of the short circuit detection voltage V1 in step S1 is measured by the ammeter A, and whether or not the edge ring circuit is short circuited is detected by comparing the measured current value (hereinafter, may be referred to as "current value I1") and a predetermined threshold value B1. The threshold value B1 used for the short circuit detection can be predetermined by measuring the value of the current that flows when the short circuit detection voltage V1 is applied to the edge ring circuit prior to the detection of wiring abnormality, for example.

Specifically, for example, when the current value I1 is not measured, i.e., when the measured current value I1 is 0 A, it is determined that the wiring is not connected to the DC power supply 60 or the disconnection has occurred right behind the downstream side of the DC power supply 60 (FIG. 4D) (step S2-1 in FIG. 5). In that case, for example, an alarm is issued to notify that the wiring abnormality (FIG. 4D) has occurred in the edge ring circuit and, then, the application of the short circuit detection voltage V1 from the DC power supply 60 is stopped.

Further, for example, when the measured current value I1 is higher than or equal to the threshold value B1, it is determined that the edge ring circuit is short circuited and an excessive current is flowing (step S2-2 in FIG. 5). In that case, for example, an alarm is issued to notify that the edge ring circuit is short circuited, and the application of the short circuit detection voltage V1 from the DC power supply 60 is stopped.

When the measured current value I1 is less than the threshold value B1, it is determined that the edge ring circuit is not short circuited and at least the wiring is connected to the DC power supply 60, and the short circuit detection pass is notified (step S2-3 in FIG. 5).

Next, after the application of the short circuit detection voltage V1 from the DC power supply 60 is stopped, a DC pulse voltage for disconnection detection (hereinafter, may be referred to as "disconnection detection voltage V2") is applied from the DC power supply 60 to the edge ring 14 (step S3 in FIG. 5). As the disconnection detection voltage V2, an arbitrary voltage to be described later is applied under pulse conditions of, for example, a frequency of 20 kHz and a duty ratio of 60%.

Next, the current flowing through the edge ring circuit due to the application of the disconnection detection voltage V2 in step S3 is measured by the ammeter A, and whether or not the edge ring circuit is short circuited is detected by comparing the measured current value (hereinafter, may be referred to as "current value I2") and a predetermined threshold value B2. At this time, whether or not startup failure has occurred in the edge ring circuit is detected by comparing the current value I2 and the threshold value B2 within a predetermined time period t (e.g., 3 seconds in the example of FIG. 5).

Specifically, for example, when the current value I2 reaches the threshold value B2, i.e., when the current flows to the edge ring 14 (the chamber 10), but it takes 3 seconds or more to reach the threshold value B2, it is determined that the startup failure has occurred in the edge ring circuit (step S4-1 in FIG. 5). In other words, it is determined that the wiring is connected to the edge ring 14 but the current does not flow appropriately due to, e.g., poor connection or the like. In that case, for example, an alarm is issued to notify that the startup failure has occurred in the edge ring circuit and, then, the application of the disconnection detection voltage V2 from the DC power supply 60 is stopped.

For example, when the measured current value I2 is less than the threshold value B2, it is determined that wiring abnormality (disconnection or non-connection to each element) has occurred in the edge ring circuit (step S4-2 in FIG. 5). In that case, for example, an alarm is issued to notify that wiring abnormality has occurred in the edge ring circuit, more preferably the location of the wiring abnormality in the edge ring circuit, and, then, the application of the disconnection detection voltage V2 from the DC power supply 60 is stopped.

Figure 6:
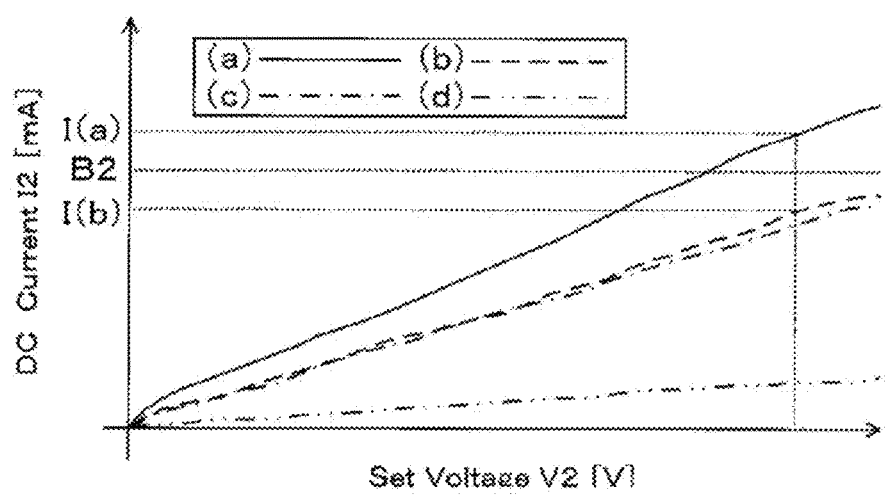
FIG. 6 is a graph showing an example of VI characteristics.

The detection of the wiring abnormality in the edge ring circuit in step S4-2 will be described in detail. FIG. 6 is a graph showing an example of VI characteristics showing the relationship between the disconnection detection voltage V2 and the current value I2. The state (a) shown in the legend of FIG. 6 corresponds to the normal connection state (FIG. 4A) and the states (b) to (d) correspond to the states in which the wiring abnormality has occurred (FIGS. 4B to 4D) respectively.

As shown in the (a) in FIG. 6, when no wiring abnormality has occurred in the edge ring circuit, a current flows properly through the entire edge ring circuit, i.e., from the DC power supply 60 to the edge ring 14 (the chamber 10) due to the application of the disconnection detection voltage V2. At this time, the current value I2 measured by the ammeter A is determined depending on the disconnection detection voltage V2 as shown in the VI characteristic of the (a) in FIG. 6.

On the other hand, as shown in the (b) to (d) in FIG. 6, when wiring abnormality has occurred in the edge ring circuit, a current flows from the DC power supply 60 to the location of the wiring abnormality by the application of the disconnection detection voltage V2. In other words, since no current flows on the downstream side of the location of the wiring abnormality in the edge ring circuit, the circuit constant changes (the electrostatic capacitance of the element disposed on the downstream side of the location of the wiring abnormality decreases), and the measured current value I2 is reduced compared to that in the normal connection state (FIG. 4A). Therefore, as shown in FIG. 6, the threshold value B2 is preset between the current value I(a) as first VI characteristic measured in the normal state and the current value I(b) as second VI characteristics measured when wiring abnormality has occurred based on the pre-obtained VI characteristics. Accordingly, it is possible to detect whether or not wiring abnormality has occurred in the edge ring circuit by comparing the current value I2 actually measured by the ammeter A with the threshold value B2.

As described above, when wiring abnormality has occurred in the edge ring circuit, no current flows on the downstream side of the location of the wiring abnormality. Therefore, the measured current value I2 is decreased depending on the electrostatic capacitance of the element disposed on the downstream side of the location of the wiring abnormality. From the above, it is possible to detect, based on the current value I2 measured by the ammeter A, which of the wiring that connects the LF filter 64 and the HF filter 63 (FIG. 4B), the wiring on the upstream side of the LF filter 64 (FIG. 4C), and the wiring right behind the downstream side of the DC power supply 60 (FIG. 4D) has the wiring abnormality.

As shown in FIG. 6, the disconnection detection voltage V2 applied to the edge ring circuit can be arbitrarily determined. At this time, by increasing the disconnection detection voltage V2 to be applied, it is possible to increase the settable range of the threshold value B2, i.e., the difference between the current value I(a) and the current value I(b), and also possible to more appropriately detect wiring abnormality while distinguishing the normal connection state (FIG. 4A) and the states in which wiring abnormality has occurred (FIGS. 4B to 4D). On the other hand, by decreasing the disconnection detection voltage V2 to be applied, it is possible to reduce the influence of the application of the disconnection detection voltage V2 on the electrostatic chuck 13 and the generation of residual charges as described in Japanese Patent Application Publication No. H10-308439. From the above, the disconnection detection voltage V2 in the present embodiment is preferably lower than the voltage applied to the edge ring 14 in the normal plasma processing, and is preferably a voltage (e.g., 300V to 500V) at which the threshold value B2 can be appropriately set.

Referring back to the description of FIG. 5, when the measured current value I2 is higher than or equal to the threshold value B2 and the measured current value I2 has reached the threshold value B2 within 3 seconds, it is determined that no wiring abnormality has occurred in the edge ring circuit, and the disconnection detection pass is notified (step S4-3 in FIG. 5). When it is determined that no wiring abnormality has occurred in the edge ring circuit in this way, the application of the disconnection detection voltage V2 from the DC power supply 60 is stopped, and a series of wiring abnormality detection processes is completed.

In accordance with the wiring abnormality detection according to the embodiment, it is possible to detect wiring abnormality, e.g., non-connection or disconnection of the wiring, in the edge ring circuit by measuring the current that flows due to the application of the disconnection detection voltage V2 to the edge ring circuit using the ammeter A and comparing the measured current value I2 with the predetermined threshold value B2.

At this time, by monitoring the decreased amount of the measured current value I2 from the current value I(a) measured at the time of normal wiring connection, it is possible to estimate the electrostatic capacitance of the portion where the current flows due to the application of the disconnection detection voltage V2. In other words, the location of the wiring abnormality can be specified.

In accordance with the present embodiment, various wiring abnormalities in the edge ring circuit can be detected only by applying the short circuit detection voltage V1 and the disconnection detection voltage V2 from the DC power supply 60 connected to the edge ring circuit. In other words, various wiring abnormalities can be detected by the conventional interlock mechanism without providing a new interlock mechanism or the like in the plasma processing apparatus 1, which makes its application to the conventional plasma processing apparatus 1 easier.

Further, in accordance with the present embodiment, the disconnection detection voltage V2 is lower than the voltage applied to the edge ring 14 in the normal plasma processing, and a voltage (e.g., 300 V to 500 V) at which the threshold value B2 can be appropriately set is applied under the pulse conditions of, e.g., a frequency of 20 kHz and a duty ratio of 60%. The pulse conditions of the disconnection detection voltage V2 are not limited thereto. For example, the frequency is determined between 0.1 kHz and 100 kHz, preferably between 1 kHz and 50 kHz, and the duty ratio is preferably determined between 10% and 90%.

Here, in the case of detecting wiring abnormality by applying the disconnection detection voltage V2 to the edge ring circuit in a continuous wave instead of a pulse wave, no current flows in the circuit at a low voltage (e.g., 300 V to 500 V) described in the above example, and the current value cannot be measured. In other words, as described in Japanese Patent Application Publication No. H10-308439, in order to measure the current value I2 in the edge ring circuit using a continuous wave, it is necessary to apply a voltage higher than that in a normal operation. In that case, abnormal discharge may occur on the current application path or between the electrostatic chuck 13 and the edge ring 14.

Therefore, in the present embodiment, the disconnection detection voltage V2 is applied to the edge ring circuit in a pulse wave containing an RF component unlike a continuous wave. Accordingly, a sufficient amount of current that can be detected can flow in the circuit even at a low voltage (e.g., 300 V to 500 V) described in the above example. In other words, wiring abnormality can be detected. As a result, it is possible to appropriately detect wiring abnormality by appropriately setting the threshold value for detecting the current value I2 compared to the case of using the continuous wave, and also possible to suppress the occurrence of abnormal discharge.

Further, in accordance with the present embodiment, prior to the application of the above-described disconnection detection voltage V2, the short circuit detection voltage V1 lower than the disconnection detection voltage V2 is applied to detect the short circuit detection of the edge ring circuit. When the disconnection detection voltage V2 is applied in a state where the edge ring circuit is short circuited, abnormal discharge may occur in the edge ring circuit due to the application of the disconnection detection voltage V2. Therefore, in the present embodiment, the short circuit detection at a low voltage is performed in advance in this way and, hence, the risk of occurrence of abnormal discharge due to the application of the disconnection detection voltage V2 is reduced.

In the wiring abnormality detection according to the embodiment, prior to the application of the disconnection detection voltage V2, the short circuit detection voltage V1 is applied to perform the short circuit detection. However, when a voltage with a low risk of abnormal discharge is applied as the disconnection detection voltage V2, or when the short circuit detection of the edge ring circuit has been completed, for example, the short circuit detection process (steps S1 and S2 in FIG. 5) may be omitted appropriately.

As described above, in the wiring abnormality detection according to the embodiment, the wiring abnormality in the edge ring circuit is detected based on the change in the circuit constant depending on the connection state of each element constituting the edge ring circuit, more specifically, the change in the electrostatic capacitance depending on the connection state. Therefore, for example, when the difference between the current value I(a) measured in the normal connection state ((a) shown in FIG. 6) and the current value I(b) measured when the wiring abnormality has occurred ((b) shown in FIG. 6) is reduced due to the change in device characteristics or the like, it may be difficult to appropriately set the threshold value B2 and appropriately detect the wiring abnormality. More specifically, when the difference in the electrostatic capacitance between the chamber 10 and the edge ring circuit is reduced, e.g., when the electrostatic capacitance of the chamber 10 is small or when the electrostatic capacitance of the RF filter 62 is large, it may be difficult to appropriately set the threshold value B2 and distinguish the normal connection state and the state in which wiring abnormality has occurred.

<Wiring Abnormality Detection According to Second Embodiment>

Figure 7:
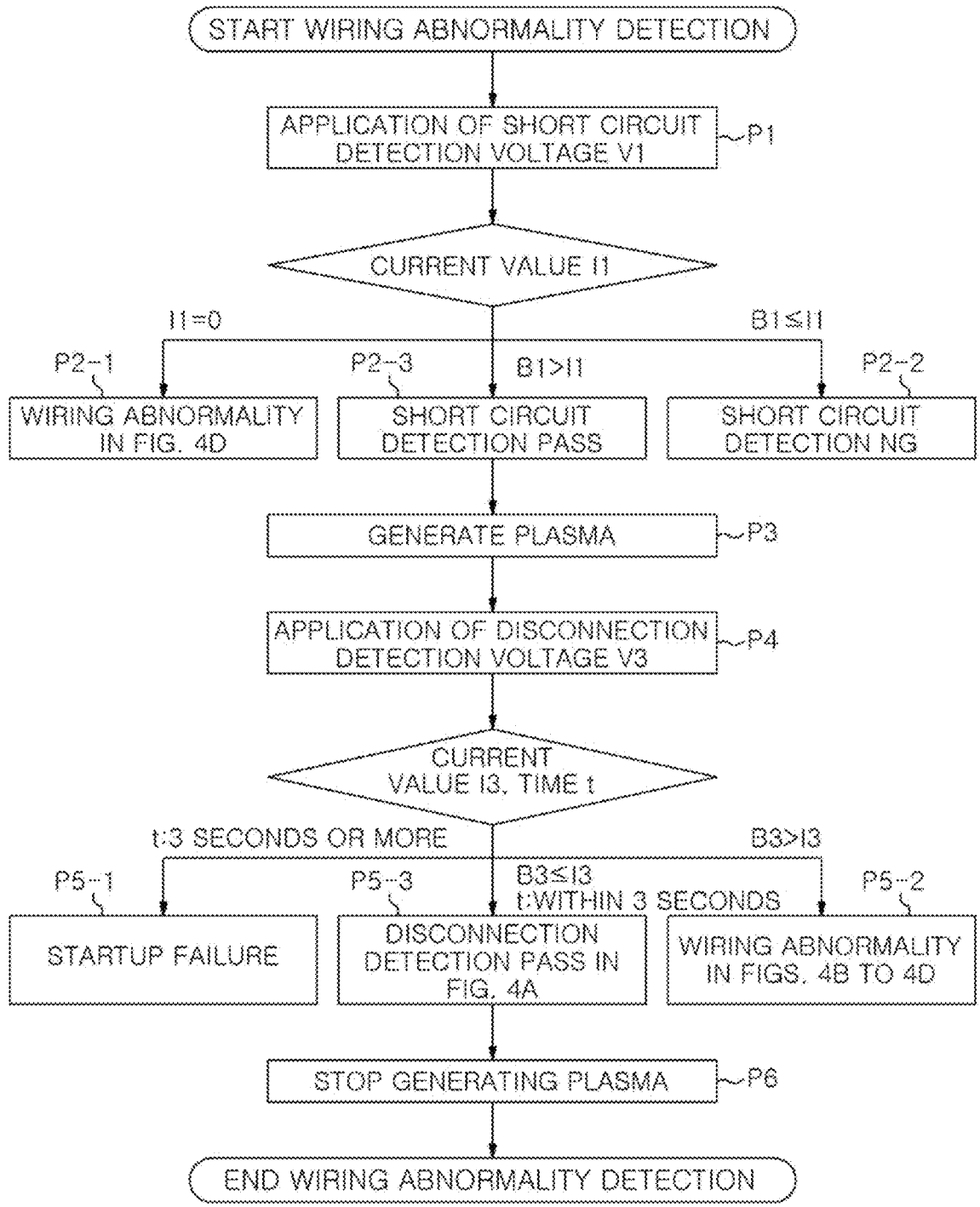
FIG. 7 is a flowchart showing a main process of a wiring abnormality detection method according to a second embodiment.

Hereinafter, a wiring abnormality detection according to a second embodiment in the case where the difference in the electrostatic capacitance between the chamber 10 and the edge ring circuit is small will be described. FIG. 7 is a flowchart showing a main process of detecting wiring abnormality in the edge ring circuit according to the second embodiment. The state (a) shown in the flowchart of FIG. 7 corresponds to the normal connection state (FIG. 4A) and the states (b) to (d) correspond to the states in which wiring abnormality has occurred (FIGS. 4B to 4D) respectively. In the following description, redundant description of the same processes as those in the wiring abnormality detection according to the first embodiment shown in FIG. 5 may be omitted.

As shown in FIG. 7, in detecting wiring abnormality in the edge ring circuit according to the second embodiment, first, the short circuit detection voltage V1 is applied from the DC power supply 60 to the edge ring 14 in a state where the wafer W is not loaded into the plasma processing apparatus 1 (step P1 in FIG. 7). The short circuit detection voltage V1 is applied to the edge ring circuit under the same conditions as those for the wiring abnormality detection according to the first embodiment.

Next, the current that flows through the edge ring circuit due to the application of the short circuit detection voltage V1 in step P1 is measured by the ammeter A, and the measured current value I1 is compared with the predetermined threshold value B1 to detect whether or not the edge ring circuit is short circuited (step P2 in FIG. 7).

The method for detecting short circuit of the edge ring circuit according to the present embodiment is the same as the method for detecting short circuit of the edge ring circuit according to the first embodiment. In other words, when the current value I1 is not measured, for example, it is determined that the wiring is not connected to the DC power supply 60 or the disconnection has occurred right behind the downstream side of the DC power supply 60 (step P2-1 in FIG. 7). Further, when the measured current value I1 is higher than or equal to the threshold value B1, for example, it is determined that the edge ring circuit is short circuited and an excessive current is flowing (step P2-2 in FIG. 7).

When the measured current value I1 is less than the threshold value B1, it is determined that the edge ring circuit is not short circuited and at least the wiring is connected to the DC power supply 60, and the short circuit detection pass is notified (Step P2-3 in FIG. 7).

Next, the application of the short circuit detection voltage V1 from the DC power supply 60 is stopped and, then, plasma is generated in the chamber 10 (step P3 in FIG. 7). Specifically, first, the processing gas is supplied from the gas supply source group 30 to the processing space S through the shower head 20. The RF power HF for plasma generation is supplied from the first RF power supply 50 to the lower electrode 12, so that the processing gas is excited to generate plasma.

Even when wiring abnormality has occurred in the edge ring circuit, the plasma generation in step P3 is performed under the conditions where the risk of occurrence of abnormal discharge or the like is low due to the plasma generation. For example, it is preferable that an $O_2$ gas flow rate is 800 sccm, a pressure in the chamber 10 is higher than or equal to 100 mTorr and lower than or equal to 1000 mTorr, the RF power HF of 500 W or less is applied in a continuous wave, and Vdc is less than 100 V. Further, it is preferable that plasma is generated within, e.g., 5 seconds.

A lower limit of the pressure in the chamber 10 at the time of plasma generation can be further lowered in a state where the wafer W is loaded into the chamber 10. In other words, in a state where the wafer W is not loaded, it is desirable that the pressure in the chamber 10 is 100 mTorr or higher as described above. However, when detecting the wiring abnormality in a state where the wafer W is loaded into the chamber 10, it is possible to control the pressure in the chamber 10 to 5 mTorr or higher.

When the plasma is generated in the chamber 10, a disconnection detection voltage V3 is applied from the DC power supply 60 to the edge ring 14 (step P4 in FIG. 7). As the disconnection detection voltage V3, an arbitrary voltage to be described later is applied using an arbitrary application method (applied waveform: pulse wave or continuous wave). When the disconnection detection voltage V3 is applied in a pulse wave, the pulse conditions can be, e.g., a frequency of 20 kHz and a duty ratio of 60%.

Next, the current that flows through the edge ring circuit due to the application of the disconnection detection voltage V3 in step P4 is measured by the ammeter A, and the measured current value (hereinafter, may be referred to as "current value I3") is compared with a predetermined threshold value B3 to detect whether or not the edge ring circuit is short circuited. At this time, whether or not startup failure has occurred in the edge ring circuit is detected by comparing the current value I3 and the threshold value B3 within a predetermined time period t (e.g., 3 seconds in the example of FIG. 7).

The method for detecting short circuit of the edge ring circuit according to the present embodiment is the same as the method for detecting short circuit of the edge ring circuit according to the first embodiment. In other words, for example, when the current value I3 reaches the threshold value B3, but it takes 3 seconds or more to reach the threshold value B3, it is determined that the startup failure has occurred in the edge ring circuit (step S5-1 in FIG. 7). Further, when the measured current value I3 is less than the threshold value B3, for example, it is determined that wiring abnormality has occurred in the edge ring circuit (step P5-2 in FIG. 7).

Figure 8:
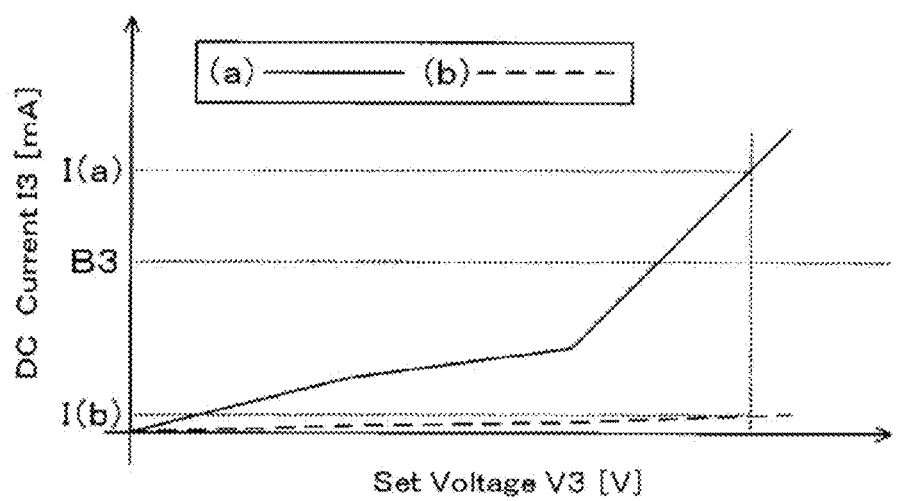
FIG. 8 is a graph showing an example of VI characteristics.

The detection of wiring abnormality in the edge ring circuit in step P5-2 will be described in detail. FIG. 8 is a graph showing an example of VI characteristics showing the relationship between the disconnection detection voltage V3 and the current value I3. The state (a) shown in the legend of FIG. 8 corresponds to the normal connection state (FIG. 4A) and the state (b) corresponds to the state in which wiring abnormality has occurred (FIG. 4B).

As shown in the state (a) in FIG. 8, when no wiring abnormality has occurred in the edge ring circuit, the current appropriately flows through the entire edge ring circuit, i.e., from the DC power supply 60 to the edge ring 14, due to the application of the disconnection detection voltage V3. Here, the edge ring 14 is disposed adjacent to the processing space S defined in the chamber 10. Therefore, in the plasma processing apparatus 1 according to the present embodiment, the DC power supply 60 and the plasma generated in the chamber 10 are connected through the edge ring 14 on an equivalent circuit. Accordingly, the current flowing through the edge ring circuit also flows through the plasma. In other words, when the edge ring circuit is normally connected and the current flows to the edge ring 14, the plasma generated in the chamber 10 can be considered as a load having a low resistance in a pseudo manner, and the current value I3 measured by the ammeter A can be increased.

On the other hand, as shown in the state (b) in FIG. 8, when wiring abnormality has occurred in the edge ring circuit, the current does not flow to the edge ring 14, i.e., to the plasma generated in the chamber 10, even if the disconnection detection voltage V3 is applied. Thus, the current value I3 measured by the ammeter A is decreased. Hence, as shown in FIG. 8, the threshold value B3 is preset between the current value I(a) measured in a normal state and the current value I(b) measured when wiring abnormality has occurred based on the pre-obtained VI characteristics. Accordingly, it is possible to detect whether or not wiring abnormality has occurred in the edge ring circuit by comparing the current value I3 actually measured by the ammeter A with the threshold value B3.

Referring back to the description of FIG. 7, when the measured current value I3 is higher than or equal to the threshold value B3 and has reached the threshold value B3 within 3 seconds, it is determined that no wiring abnormality has occurred in the edge ring circuit, and the disconnection detection pass is notified (step P5-3 in FIG. 7). When it is determined that no wiring abnormality has occurred in the edge ring circuit in this way, the supply of the processing gas to the processing space S and the supply of the RF power HF to the lower electrode 12 are stopped to stop the generation of plasma in the chamber 10 (step P6 in FIG. 7). Then, the application of the disconnection detection voltage V3 from the DC power supply 60 is stopped, and a series of wiring abnormality detection processes is completed.

In accordance with the wiring abnormality detection according to the second embodiment, in the configuration in which the DC power supply 60 and the plasma generated in the chamber 10 are connected on an equivalent circuit and the current flows through the plasma capacitively or directly, by generating the plasma in the chamber 10, the plasma can be regarded as a low resistance load and the current can flow. In other words, even when the difference in the electrostatic capacitance between the chamber 10 and the edge ring circuit is small as described above, it is possible to increase the difference between the current values I(a) measured in the normal connection state and the current value I(b) measured when the wiring abnormality has occurred. Accordingly, the wiring abnormality in the edge ring circuit can be appropriately detected.

At this time, by appropriately controlling the conditions for plasma generation in the chamber 10, the risk of occurrence of abnormal discharge due to the plasma generation can be reduced even when wiring abnormality has occurred in the edge ring circuit. As for the plasma generation conditions, it is preferable to obtain in advance the plasma generation conditions in which abnormal discharge or the like does not occur by experiments or the like depending on the plasma processing apparatus 1 to be used. In accordance with the present embodiment, the current can flow while considering the plasma generated in the chamber as a low resistance load, so that the disconnection detection voltage V3 applied from the DC power supply 60 to the edge ring circuit can be decreased. Accordingly, the load on the electrostatic chuck 13 or the generation of residual charges can be appropriately suppressed.

In the case of decreasing the disconnection detection voltage V3, the voltage waveform of the disconnection detection voltage V3 is not limited to a pulse wave and may be a continuous wave, unlike the wiring abnormality detection method according to the first embodiment.

As described above, the wiring abnormality can be detected by the same method in the upper electrode circuit to which the second DC power supply 70 is connected. In other words, the wiring abnormality in the upper electrode circuit can be detected by applying a DC voltage to the electrode plate 21 serving as the upper electrode instead of the edge ring 14 (the chamber 10) and comparing the measured value of the current that flows due to the application of the DC voltage with the threshold value. In that case, the electrode plate 21 serving as the upper electrode corresponds to the DC voltage application member according to the technique of the present disclosure.

In the above-described embodiment, the case of detecting the wiring abnormality in the edge ring circuit or the upper electrode circuit has been described as an example. However, the circuit to which the wiring abnormality detection method of the present disclosure is applied is not limited to that in the above-described embodiment. In other words, it is possible to detect wiring abnormality in any circuit as long as it is a power supply circuit to which a DC power supply is connected. Particularly, in a configuration in which a power supply circuit that is a wiring abnormality detection target is connected to an arbitrary object (plasma generated in the chamber 10 in the present embodiment) that can be considered as a low resistance load on an equivalent circuit, the wiring abnormality can be appropriately detected even when there is no difference in the measured current between the normal connection state of the power supply circuit and the state in which wiring abnormality has occurred.

The threshold value used in the above-described embodiment is an example. In other words, another element may be used as a threshold value instead of the measured current. Further, the threshold value can be appropriately changed based on the wiring abnormality detection method or the like.

The timing of performing the wiring abnormality detection of the present disclosure can be arbitrarily determined. In other words, the wiring abnormality may be detected periodically between the processes of the plasma processing performed on the wafer W in the plasma processing apparatus 1, or may be detected at the time of setup such as startup of the plasma processing apparatus 1 or the like. However, the wiring abnormality such as non-connection or disconnection of the wiring is often caused by the setup of the device. Therefore, it is preferable to perform the wiring abnormality detection of the present disclosure at least at the time of setup such as startup of the plasma processing apparatus 1 or the like.

In the above-described embodiment, the case where the wiring abnormality detection is performed in a state where the wafer W is not loaded into the chamber 10 has been described as an example. However, the wiring abnormality detection may be performed in a state where the wafer W is loaded into the chamber 10. In other words, the wiring abnormality detection may be appropriately performed when a problem is detected during the wafer processing, for example. In that case, when the plasma is generated in the chamber 10, the lower limit of the pressure in the chamber 10 can be lowered among the conditions related to the plasma generation as described above.

As described above, the embodiments of the present disclosure are illustrative in all respects and are not restrictive. The above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A wiring abnormality detection method in a plasma processing apparatus,
wherein the plasma processing apparatus includes:
a chamber where plasma processing is performed on a substrate;
a stage disposed in the chamber and having an electrostatic chuck configured to chuck the substrate;
a RF power supply configured to generate plasma in the chamber;
a DC power supply system configured to control plasma generated in the chamber; and
an ammeter configured to measure a current flowing in the DC power supply system,
wherein the DC power supply system constitutes a circuit in which a DC power supply configured to apply a DC voltage to the DC power supply system, an RF filter configured to remove an RF component from the DC power supply, and a DC voltage application member to which the DC voltage is applied are electrically connected in this order,
the detection method comprising:
applying a DC voltage from the DC power supply;
measuring a current flowing in the circuit constituting the DC power supply system;

comparing the measured current with a predetermined threshold value; and determining that wiring abnormality has occurred in the circuit constituting the DC power supply system when the measured current is greater than or equal to the threshold value.

2. The wiring abnormality detection method of claim 1, wherein the DC power supply applies the DC voltage in a pulse wave.

3. The wiring abnormality detection method of claim 1, further comprising:

specifying a location of wiring abnormality in the circuit based on the measured current.

4. The wiring abnormality detection method of claim 1, further comprising:

generating plasma in the chamber prior to said applying the DC voltage from the DC power supply.

5. The wiring abnormality detection method of claim 4, wherein the plasma is generated under conditions that a pressure in the chamber is 1000 mTorr or less and a power applied from the RF power supply is 500 W or less.

6. The wiring abnormality detection method of claim 4, wherein the DC power supply applies the DC voltage in a pulse wave or a continuous wave.

7. The wiring abnormality detection method of claim 1, wherein the threshold value is predetermined by comparing first VI characteristic obtained by applying the DC voltage in a state wiring abnormality has not occurred in the DC power supply system and second VI characteristic obtained by applying the DC voltage in a state where wiring abnormality has occurred in the DC power supply system.

8. The wiring abnormality detection method of claim 1, further comprising:

performing a short circuit detection in the circuit prior to said applying the DC voltage from the DC power supply.

9. The wiring abnormality detection method of claim 1, wherein the DC voltage application member is an edge ring disposed around a substrate placed on the stage, or an upper electrode disposed above the stage.

10. A plasma processing apparatus for performing plasma processing on a substrate, comprising:

a chamber where plasma processing is performed on the substrate;

a stage disposed in the chamber and having an electrostatic chuck configured to attract and hold the substrate;

a RF power supply configured to generate plasma in the chamber;

a DC power supply system configured to control the plasma generated in the chamber;

an ammeter configured to measure a current flowing in the DC power supply system; and a controller configured to control an operation of the DC power supply system, wherein the DC power supply system constitutes a circuit in which a DC power supply configured to apply a DC voltage to the DC power supply system, an RF filter configured to remove an RF component from the DC power supply, and a DC voltage application member to which the DC voltage is applied are electrically connected in this order, wherein the controller controls the DC power supply system to execute:

applying a DC voltage from the DC power supply;

measuring a current flowing in the circuit constituting the DC power supply system;

comparing the measured current with a predetermined threshold value; and determining that wiring abnormality has occurred in the circuit constituting the DC power supply system when the measured current is greater than or equal to the threshold value.

11. The plasma processing apparatus of claim 10, wherein the controller controls operation of the RF power supply to generate plasma in the chamber prior to said applying the DC voltage from the DC power supply.

12. The plasma processing apparatus of claim 10, wherein the DC power supply is configured to switch an applied waveform of the DC voltage between a pulse wave and a continuous wave.

13. The plasma processing apparatus of claim 10, wherein the DC voltage application member is an edge ring disposed around a substrate placed on the stage, or an upper electrode disposed above the stage.

14. The plasma processing apparatus of claim 10, wherein the DC power supply is configured to apply the DC voltage in a pulse wave.

15. The plasma processing apparatus of claim 10, wherein the controller controls the DC power supply system to specify a location of wiring abnormality in the circuit based on the measured current.

16. The plasma processing apparatus of claim 11, wherein the plasma is generated under conditions that a pressure in the chamber is 1000 mTorr or less and a power applied from the RF power supply is 500 W or less.

17. The plasma processing apparatus of claim 10, wherein the threshold value is predetermined by comparing first VI characteristic obtained by applying the DC voltage in a state wiring abnormality has not occurred in the DC power supply system and second VI characteristic obtained by applying the DC voltage in a state where wiring abnormality has occurred in the DC power supply system.

18. The plasma processing apparatus of claim 10, the controller controls the DC power supply system to perform a short circuit detection in the circuit prior to said applying the DC voltage from the DC power supply.

* * * * *